United States Patent [19]
Gilbert et al.

[11] Patent Number: 5,508,539
[45] Date of Patent: Apr. 16, 1996

[54] ELEVATED-GATE FIELD EFFECT TRANSISTOR STRUCTURE AND FABRICATION METHOD

[75] Inventors: James G. Gilbert, Tempe; Lawrence S. Klingbeil, Jr., Chandler; David J. Halchin, Chandler; John M. Golio, Chandler, all of Ariz.

[73] Assignee: Motorola, Inc., Schaumburg, Ill.

[21] Appl. No.: 425,733

[22] Filed: Apr. 20, 1995

Related U.S. Application Data

[63] Continuation of Ser. No. 235,745, Apr. 29, 1994, abandoned.

[51] Int. Cl.$^6$ ............................. H01L 29/80; H01L 27/02
[52] U.S. Cl. ....................... 257/280; 257/283; 257/286; 257/472
[58] Field of Search ............................. 257/283, 192, 257/194, 472, 900, 280, 289, 282, 286

[56] References Cited

U.S. PATENT DOCUMENTS

| | | | |
|---|---|---|---|
| 4,407,004 | 9/1983 | Yeh | 357/23 |
| 4,587,540 | 5/1986 | Jackson | 357/22 |
| 4,698,654 | 10/1987 | Kohn | 357/22 |
| 4,755,858 | 7/1988 | Thompson et al. | 357/22 |
| 4,768,071 | 8/1988 | Etienne et al. | 357/22 |
| 4,845,534 | 7/1989 | Fukuta | 257/283 |
| 4,960,718 | 10/1990 | Aina | 437/22 |
| 4,965,218 | 10/1990 | Geissberger et al. | 437/41 |

FOREIGN PATENT DOCUMENTS

| | | | |
|---|---|---|---|
| 56-71980 | 6/1981 | Japan | 257/283 |
| 59-152669 | 8/1984 | Japan | 257/280 |
| 63-120471 | 5/1988 | Japan | 257/280 |
| 1-57759 | 3/1989 | Japan | 257/280 |
| 1-161772 | 6/1989 | Japan | 257/900 |
| 1-261870 | 10/1989 | Japan | 257/900 |

*Primary Examiner*—Donald L. Monin, Jr.
*Attorney, Agent, or Firm*—Bruce T. Neel

[57] ABSTRACT

A field effect transistor (10) has an active layer (16) formed in a substrate (12). A gate (20) is disposed on an elevated platform (18) formed from the active layer (16). The elevated platform (18) raises the bottom surface (21) of the gate (20) relative to the top surface (34, 36) of the active region (13) on either side of the gate (20). A fabrication method for the transistor (10) forms the elevated platform (18) by etching the active region surface (44) on both sides of the gate (20) so that the bottom surface (21) of the gate (20) is elevated relative to the top surface (34) of the surrounding active region (13). The gate (20) itself and/or a patterned photoresist layer (116) may be used as a mask for performing this etch.

15 Claims, 5 Drawing Sheets

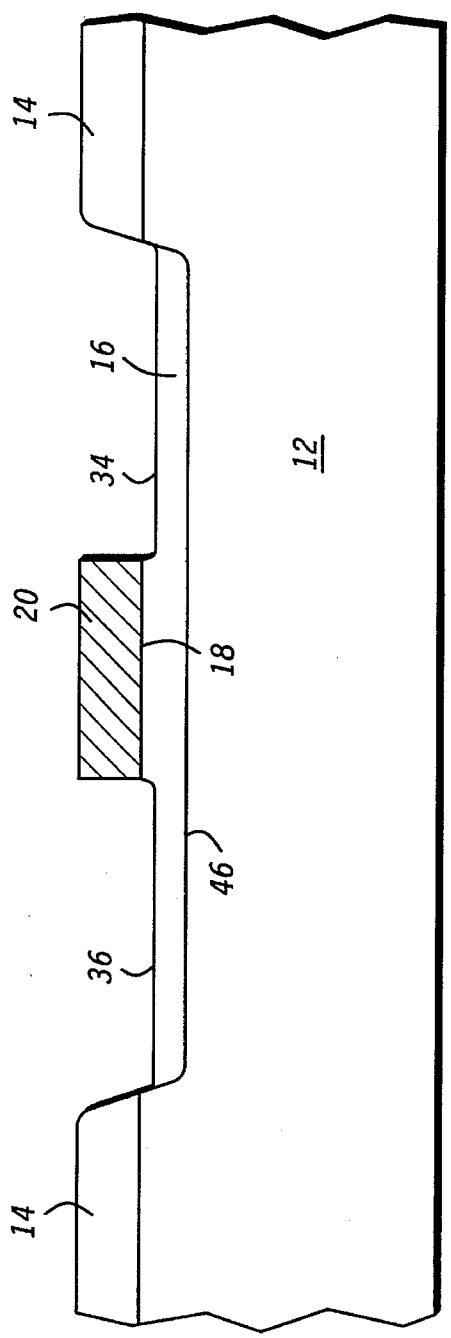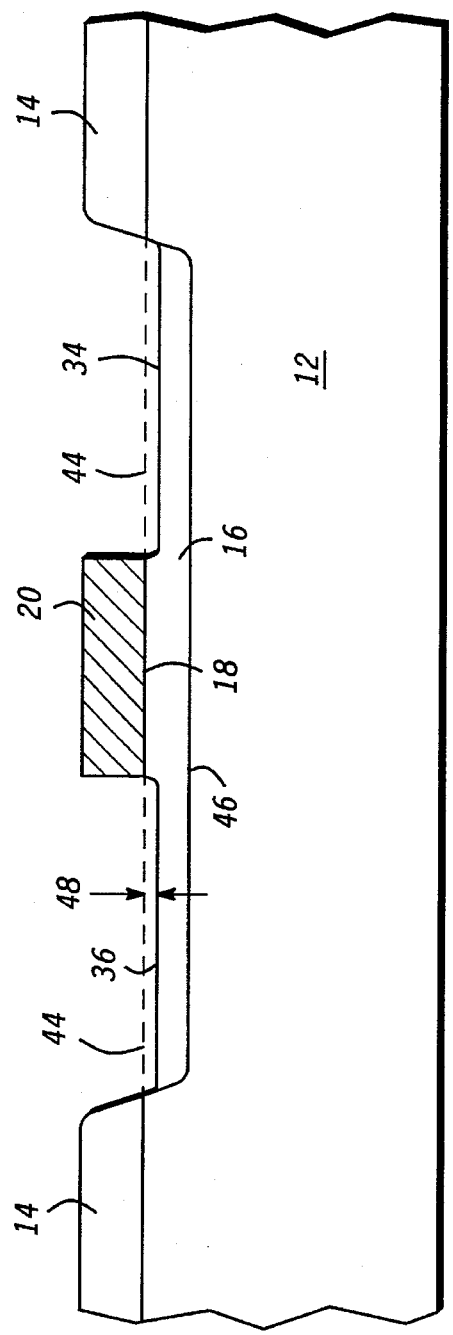

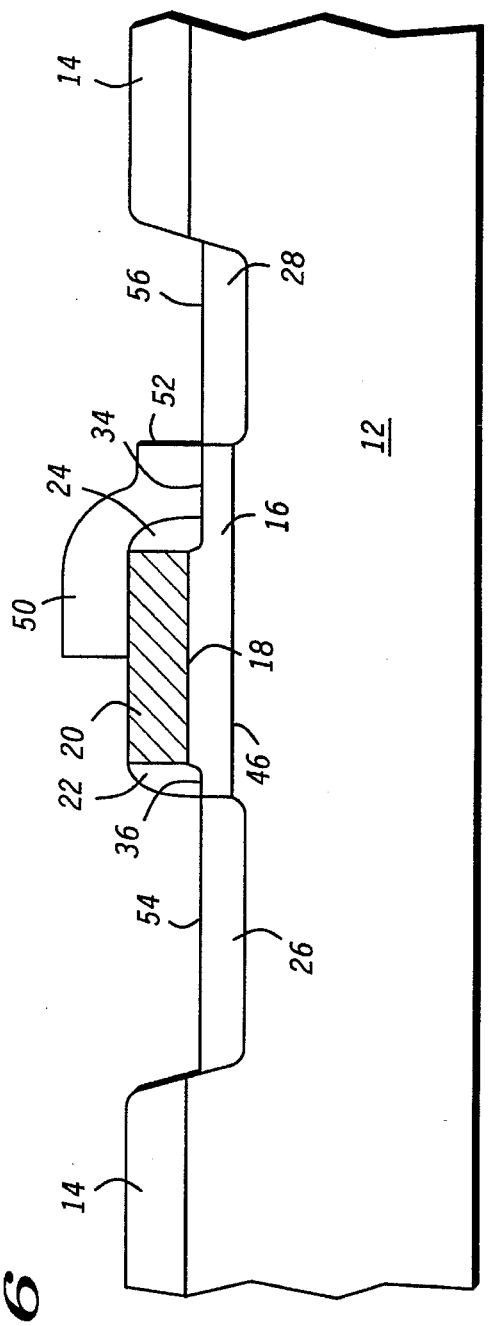
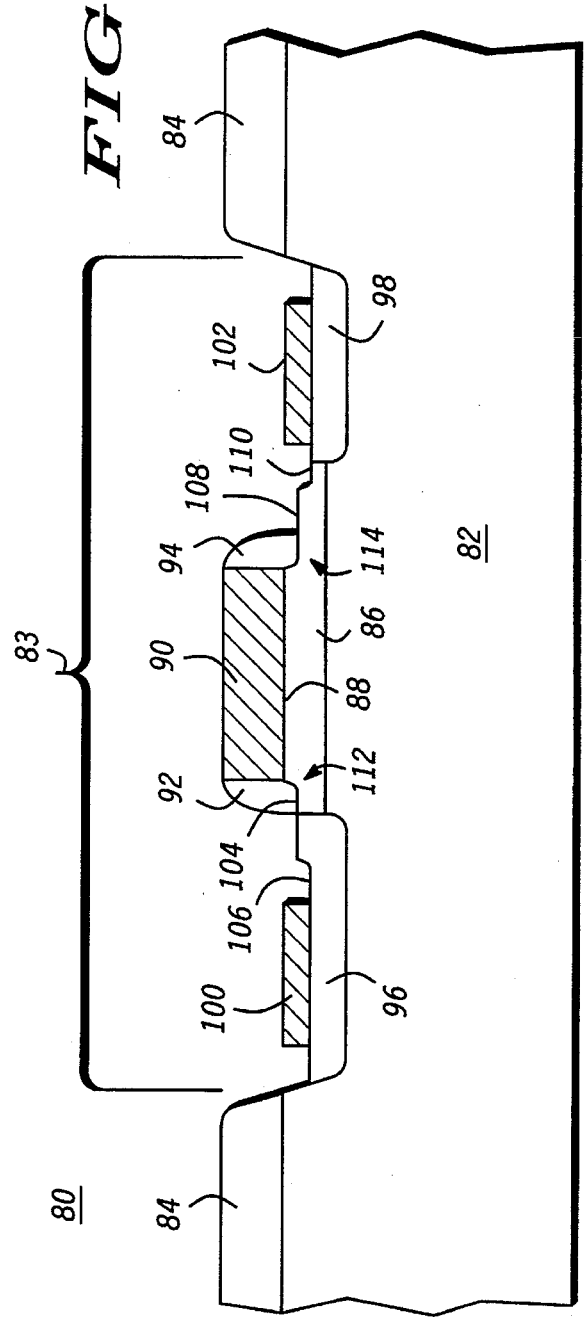

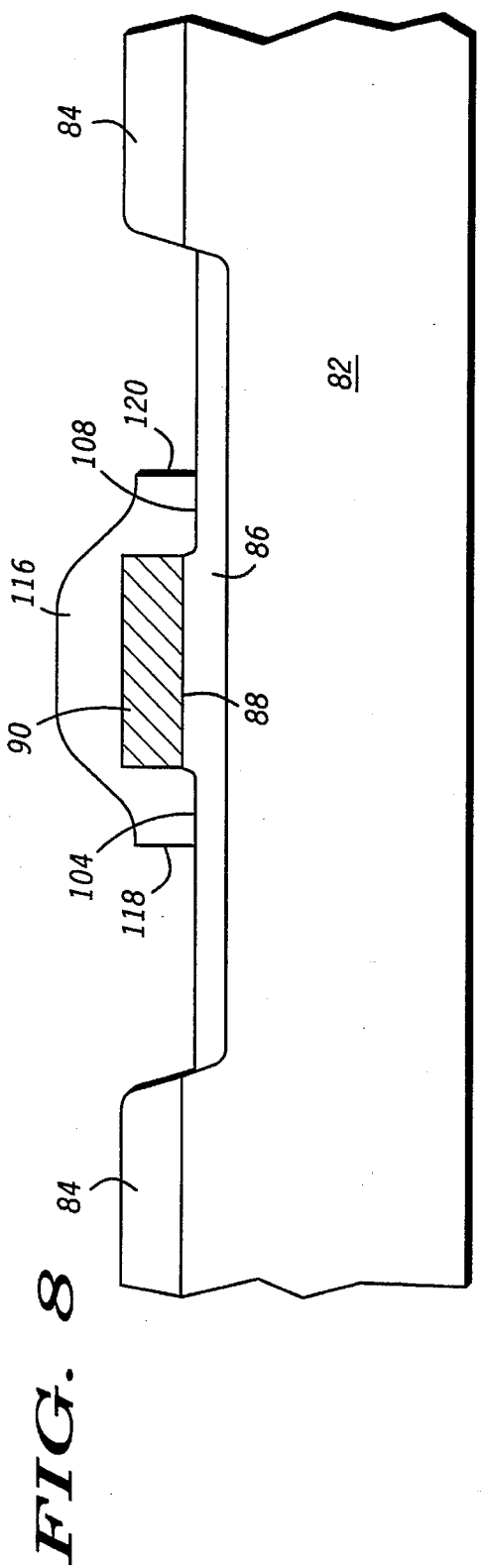
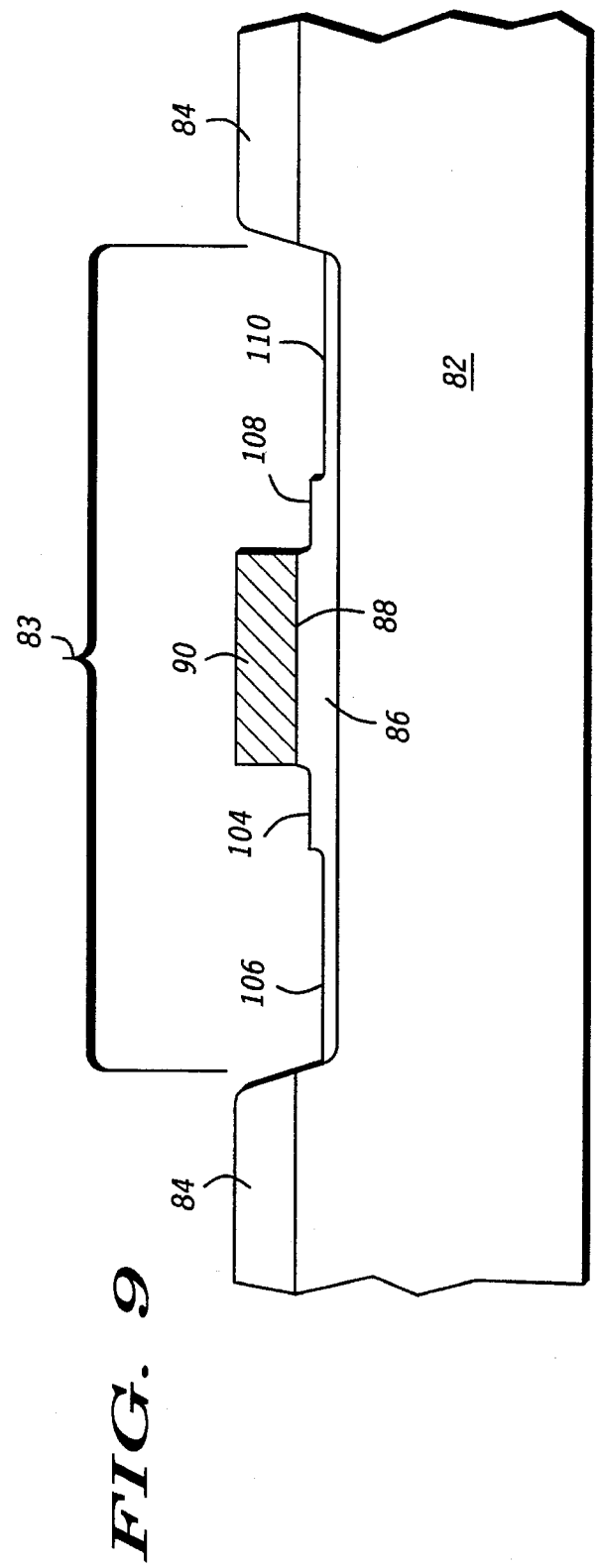

ELEVATED-GATE FIELD EFFECT TRANSISTOR STRUCTURE AND FABRICATION METHOD

This application is a continuation of prior application Ser. No. 08/235,745, filed Apr. 29, 1994, now abandoned.

FIELD OF THE INVENTION

This invention relates, in general, to a semiconductor device and, more particularly, to a field effect transistor having improved breakdown voltage and a fabrication method for forming such a transistor.

BACKGROUND OF THE INVENTION

In the design of a field effect transistor (FET) device, it is often desirable to increase the device's saturated drain-source current ($I_{dss}$) without a corresponding decrease in the device's gate-to-drain breakdown voltage ($BV_{gd0}$). However, a fundamental limitation in the design of a typical FET, such as a metal semiconductor FET (MESFET), is that breakdown voltage generally can only be increased at the expense of a lowered $I_{dss}$. Similarly, $I_{dss}$ can generally only be increased at the expense of a lowered breakdown voltage.

One specific application in which it is desirable to increase breakdown voltage without a corresponding decrease in $I_{dss}$ is in radio frequency (RF) power MESFETs. Specifically, in such a MESFET it is desirable to have both high output power and low side band noise. High output power for such a device correlates directly to high $I_{dss}$, and low side band noise correlates directly to high breakdown voltage. However, as discussed above, in existing MESFET devices it is difficult to increase breakdown voltage without a corresponding decrease in $I_{dss}$.

Two typical types of MESFETs used in RF power applications are planar MESFETs and recessed-gate MESFETs. In a planar MESFET, the relationship between $I_{dss}$ and breakdown voltage can only be controlled by varying channel doping and source/drain electrode spacing. There is no other effective means for optimizing the device's breakdown voltage characteristics. Despite this limitation, though, planar self-aligned MESFET structures are commonly used and have the advantages of a self-aligned device and good control during manufacture.

A recessed-gate MESFET differs in structure from a planar MESFET and is used as an attempt to overcome the limitations of the inverse relationship between breakdown voltage and $I_{dss}$. Simply stated, a recessed-gate MESFET is a device having its gate formed upon a recessed region in the active region of the device which is formed by a recess etch of the active region. The gate is recessed so that the electric field at the edges of the gate are reduced; this allows the breakdown voltage of the device to be increased without a decrease in $I_{dss}$. Thus, the relationship between $I_{dss}$ and breakdown voltage can be controlled by channel doping, electrode spacing, and the recess etch depth. However, the process for fabricating a recessed-gate MESFET does not permit the use of self-aligned source/drain regions, which are desirable for achieving ever smaller device geometries, and the recess region itself is formed by removing a portion of the active area directly under the gate. This removal is disadvantageous because it leads to poor control of device parameters, such as $I_{dss}$ and threshold voltage, during manufacture.

Thus, it would be advantageous to have a structure for a FET device that improves $BV_{gd0}$ without a corresponding decrease in $I_{dss}$ and that can be self-aligned with good process control of device characteristics.

BRIEF DESCRIPTION OF THE DRAWINGS

FIGS. 2–6 are cross-sections illustrating the manufacture of the MESFET of FIG. 1;

FIG. 7 is a cross-section illustrating the structure of a MESFET according to an alternate embodiment of the present invention; and FIGS. 8 and 9 are cross-sections illustrating the manufacture of the MESFET of FIG. 7.

DETAILED DESCRIPTION OF THE DRAWINGS

According to the present invention, a structure for improving the breakdown voltage characteristics of a FET is described below. It is believed that these characteristics are improved by a reduction of the electric field intensity in the region beneath the edges of the gate and that this reduction is achieved in a FET having its gate resting upon an elevated platform, which elevates the bottom surface of the gate electrode relative to the top surface of the active region on either side of the gate. Also described below is a method according to the present invention for forming such an elevated platform FET structure. In one embodiment, this method provides an elevated platform structure by etching the active region surface on both sides of the gate so that the bottom surface of the gate is higher than the top surface of the surrounding active region. The gate itself and/or a patterned photoresist layer may be used as a mask for performing this etch, as discussed further below.

Although the present invention is described below with particular reference to compound semiconductor MESFET devices (using, for example, GaAs or InP substrates), it is not intended that the scope of the present invention be limited as such. Rather, one of skill in the art will recognize that the present invention may be applied to other types of FETs such as, for example, Si-based FETs (such as junction FETs) and metal oxide semiconductor FETs (MOSFETs). Further, although the specific embodiments described below are depletion MESFETs which utilize n-doped channels, those of skill in the art will recognize that the present invention may also be applied to enhancement devices and/or to devices with p-doped channels. Moreover, the term "elevated platform" as used herein is only for purposes of description and one of skill in the art will recognize that many shapes of elevated platforms can be formed according to the present invention. For example, the shape of the elevated platform will vary with variations in the width of the active channel of a device, as will be appreciated below.

Figure 1:
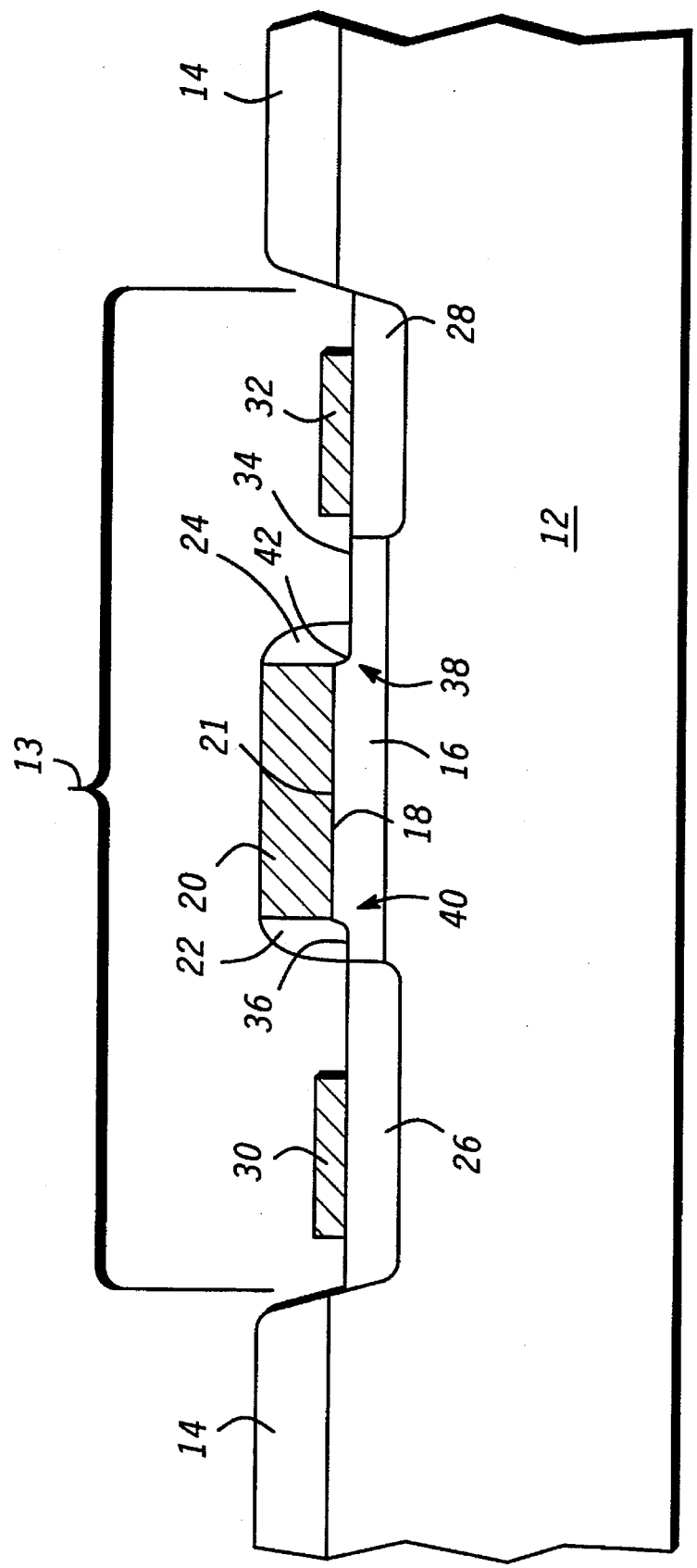
FIG. 1 is a cross-section illustrating the structure of a MESFET according to one embodiment of the present invention.

Now referring to FIG. 1, an n-channel depletion MESFET 10 is shown overlying a compound semiconductor substrate 12, which is preferably, for example, un-doped GaAs. An active region 13 of MESFET 10 is substantially defined by a field oxide layer 14, such as silicon oxide. A surface portion of substrate 12 has been previously doped to form an active layer 16, which includes a channel for MESFET 10. The top surface of active layer 16 provides an elevated platform 18 for a gate 20, and a bottom surface 21 of gate 20 contacts elevated platform 18. The junction between active layer 16 and gate 20 forms a Schottky barrier.

Source and drain spacers 22 and 24 are disposed on the sides of gate 20. A heavily-doped source region 26 has its edges defined by field oxide layer 14 and spacer 22, and a heavily-doped drain region 28 has one edge defined by field oxide layer 14. Source and drain regions 26 and 28 and active layer 16 may be doped with an n-type dopant such as silicon, and both source and drain regions 26 and 28 are more heavily doped than active layer 16. A source electrode 30 forms an ohmic contact with source region 26, and a drain electrode 32 forms an ohmic contact with drain region 28.

According to the present invention, elevated platform 18, which supports gate 20, is raised relative to a top drain surface 34 of active layer 16. Also, elevated platform 18 is raised relative to a top source surface 36 of active layer 16. As a result, bottom surface 21 of gate 20 is raised relative to both top drain surface 34 and top source surface 36.

An advantage thereby achieved by the present invention is a reduction in the electric field strength in a region 38 which is proximate to and under bottom surface 21 of gate 20. Similarly, the electric field strength is reduced in a region 40 which is proximate to and under bottom surface 21. By such a reduction in electric field strength, particularly in region 38, the breakdown voltage of MESFET 10 according to the present invention is increased relative to existing planar MESFETs for a given $I_{dss}$, while also permitting self-alignment of source region 26 to spacer 22. In contrast, although existing recessed-gate MESFETs have been used to increase breakdown voltage, they do not readily allow source or drain self-alignment to the gate. Thus, according to the present invention, a novel MESFET structure is provided for improving breakdown voltage in a device having a self-aligned gate.

One of skill in the art will recognize that, although the top surface of drain region 28 and top drain surface 34 are shown as being substantially the same height in FIG. 1, in other embodiments the top surface of drain region 28 may be raised relative to top surface 34. Also, those of skill in the art will recognize that the benefits of the present invention may be achieved in structures differing from that shown in FIG. 1, as long as the bottom surface of the gate is protruding relative to the top surface of the adjacent active layer. For example, although the transition from elevated platform 18 to top drain surface 34 is substantially shown as a step 42 in FIG. 1, in other embodiments according to the present invention the transition from the elevated platform to the top drain surface may be more gradual, for example like a ramp. The nature of this transition will vary depending on the method used to form MESFET 10, as will be recognized by one of skill in the art. Further, it is not necessary that the transition from elevated platform to top drain surface be monotonic to achieve the benefits of the present invention.

Figure 2:
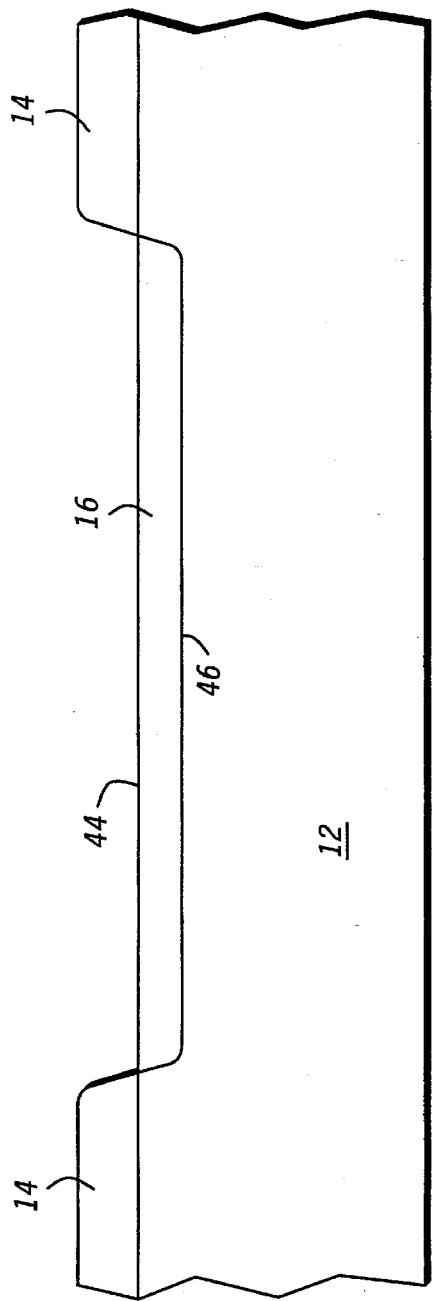

A method for fabricating MESFET 10, as shown in FIG. 1 above, according to the present invention is now illustrated in FIGS. 2–6. Common elements with FIG. 1 use common reference numbers. In FIG. 2 field oxide layer 14 has previously been formed and patterned on substrate 12 to define an active region of substrate 12. In a preferred embodiment, field oxide layer 14 is silicon oxide overlying silicon nitride. After patterning field oxide layer 14, active layer 16 is formed, for example, by a channel implant using ion implantation. An example of a preferred channel implant for active layer 16 is an implant of both $3.5 \times 10^{12}$ Si atoms/cm$^2$ at 170 KeV and $1.0 \times 10^{12}$ Be atoms/cm$^2$ at 120 KeV. It should be noted that at this point in processing, top surface 44 of active layer 16 is substantially planar.

Figure 3:
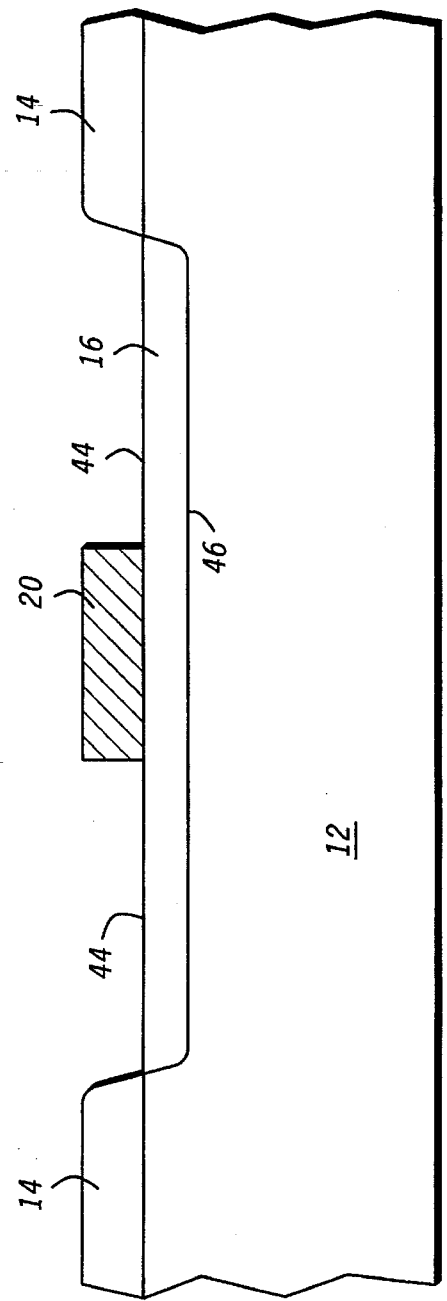

Next, as shown in FIG. 3, gate 20 is formed and patterned on top surface 44 of active layer 16. The material used to form gate 20 is not critical. However, when gate 20 is used as an etch mask as described below, gate 20 is preferably a refractory metal or other material that will resist the etchant used. As an example, gate 20 can be a titanium tungsten nitride that is reactively sputtered using a titanium-tungsten target in a nitrogen ambient. Alternatively, a tungsten sputter target could be used.

After patterning gate 20, top surface 44 is still substantially planar. At this point in processing, active layer 16 has, for example, a depth as measured from top surface 44 to bottom surface 46 of about 1,000 to 8,000 angstroms (the corresponding distance from top surface 44 to the region of peak dopant concentration in active layer 16 is about 300 to 2,000 angstroms).

Now referring to FIG. 4, and in accordance with one embodiment of the present invention, gate 20 and field oxide layer 14 are used as a mask to etch active layer 16. This may be accomplished, for example, by either a wet or dry etch, but preferably a dry etch. For a wet etch, a dilute acid or base (such as HCl or $NH_4OH$) in conjunction with an oxidizer such as $H_2O_2$ may be used. For a dry etch, plasma etching with $C_2F_6$ or $BCl_3$ may be used. As a specific, non-limiting example a wet etch using $NH_4OH:H_2O_2:H_2O$ (1:1:150 parts by volume) at 25° C. is used to etch about 50–300 angstroms from the surface of GaAs active layer 16. If an acid etchant is desired, HCl may be substituted for $NH_4OH$. Although specific etching approaches have been provided here for descriptive purposes, one skilled in the art will recognize that other alternative etching approaches may be used in accordance with the present invention.

Following this etching step, top drain surface 34 and top source surface 36 of active layer 16 are lowered, or recessed, relative to original top surface 44 (as shown in FIG. 3) such that elevated platform 18 is higher than either top drain surface 34 or top source surface 36. This is illustrated more explicitly in FIG. 5 in which the original top surface 44 of active layer 16 is shown as a dashed line, and the depth of active layer 16 removed by this etching is indicated by arrows 48.

In the preferred embodiment, about 25–50% of the pre-etch thickness of active layer 16 is removed, and even more preferably about 25% is removed. Thus, for example, for an original active layer depth of about 800 angstroms, it is preferred that a wet etch remove an active layer thickness of about 200 angstroms. One skilled in the art will recognize that less than 25% or more than 50% of the pre-etch active layer thickness may also be removed. However, if more than 50% of the active layer's thickness is removed, the active layer should not be made so thin that device performance is degraded due to inadequate channel depth under gate 20.

In other embodiments, rather than using gate 20 as a mask for etching active layer 16 to form elevated platform 18, a photoresist layer (not shown) could be used during the etch to define the elevated platform so that its edges extend beyond the edges of gate 20. In addition, a photoresist layer (not shown) could be used in conjunction with gate 20 so that one edge of an elevated platform is defined by gate 20 and the other edge is defined by the photoresist layer. One skilled in the art will recognize that there are many ways to pattern active layer 16 during etching in order to provide an elevated platform.

Referring now to FIG. 6, spacers 22 and 24 are next formed adjoining gate 20. One approach for forming spacers 22 and 24 is the deposition of a silicon nitride layer (not shown) followed by a silicon oxide layer (also not shown). The silicon oxide and nitride layers just deposited are then etched back to provide spacers 22 and 24. Further, an optional capping silicon nitride layer (not shown) may be deposited overlying all exposed surfaces including the etched-back silicon oxide layer. By this approach spacers 22 and 24 comprise a nitride-oxide-nitride stack.

After forming spacers 22 and 24, a photoresist layer 50 is deposited and patterned to define an edge 52 for use in implanting drain region 28. Then, source region 26 and drain region 28 are formed by, for example, ion implantation of $3.5\times10^{13}$ Si atoms/cm$^2$ at 150 KeV. Source region 26 is self-aligned to spacer 22 and also defined by field oxide layer 14, and drain region 28 is defined by edge 52 of photoresist layer 50 and by field oxide layer 14. After implantation, photoresist layer 50 is removed.

Next, source electrode 30 and drain electrode 32 (both shown in FIG. 1) are respectively formed on a surface 54 of source region 26 and a surface 56 of drain region 28 using a photoresist layer (not shown). In this embodiment, surface 54 and top source surface 36 of active layer 16 are substantially planar, although this may differ in other embodiments. Likewise, in this embodiment surface 56 and top drain surface 34 of active layer 16 are substantially planar, but this could also differ in other embodiments. A capping silicon oxide layer (not shown) may be deposited, annealed, and patterned prior to forming source and drain electrodes 30 and 32. Following these process steps, MESFET 10 of FIG. 1 has been formed. Subsequent processing may be performed using known, conventional processing steps.

Although the above process described the formation of spacers 22 and 24 following the etching used to form elevated platform 18, in another embodiment according to the present invention spacers 22 and 24 could be formed prior to this etching. Referring again to FIG. 3, in this embodiment spacers 22 and 24 are formed adjacent to gate 20, for example, as described above. Then, active layer 16 is etched using spacers 22 and 24 as etching masks rather than gate 20. Alternatively, a photoresist layer could be used in conjunction with, or instead of, spacers 22 and 24 to define the dimensions of elevated platform 18, as discussed above. Following etching of active layer 16, subsequent processing is substantially similar to that above.

Thus, a MESFET is formed with improved $BV_{gd0}$. The breakdown voltages achieved in the fabricated MESFET 10 are, for example, about 25–30 V ($BV_{gd0}$) for a current ($I_{dss}$) of about 250–300 mA/mm of device width. In contrast, prior planar MESFETs typically have a breakdown voltage of only about 15 V for comparable current loads.

It was also observed in the final devices formed according to the present invention that breakdown voltage generally increased with an increasing depth of etching into the active layer, over a depth range of about 50–300 angstroms. This relationship depends, though, on the dose and energy used for the channel implant and may not always be observed for shallow channel implants.

FIG. 7 illustrates an n-channel depletion MESFET 80 according to an alternate embodiment of the present invention. MESFET 80 is formed overlying a compound semiconductor 82, for example GaAs, and an active region 83 of MESFET 80 is defined by a field oxide layer 84. An active layer 86 within active region 83 has an elevated platform 88 as its top surface, and a gate 90 is on top of elevated platform 88. Spacers 92 and 94 are adjacent to gate 90, and source and drain regions 96 and 98 have been formed in substrate 82. Source and drain electrodes 100 and 102 form ohmic contacts to source and drain regions 96 and 98, respectively.

According to the present invention, in active region 83 an upper source surface 104 has a depth greater than that of elevated platform 88, and a lower source surface 106 has a depth greater than that of upper source surface 104. Also, in active region 83 an upper drain surface 108 has a depth greater than that of elevated platform 88, and a lower drain surface 110 has a depth greater than that of upper drain surface 108. An advantage of the present invention is that it is believed that the electric field strength in regions 112 and 114 is reduced during the operation of MESFET 80.

MESFET 80 of FIG. 1 may be formed by a process substantially similar to that shown in FIGS. 2–6, with certain modifications as will be recognized by one of skill in the art. Specifically, the formation of elevated platform 88 at a height greater than that of both upper source surface 104 and upper drain surface 108 follows substantially the same process steps as illustrated in and discussed for FIGS. 2–5. Then, lower source surface 106 and lower drain surface 110 may be formed by an additional etching step illustrated in FIGS. 8 and 9.

Referring now to FIG. 8, according to the present invention, a photoresist layer 116 is deposited and patterned to form edges 118 and 120. Photoresist layer 116 is used as an etch mask for etching active layer 86. This etching is accomplished substantially as previously described above. Edge 118 and field oxide layer 84 will define the extent of lower source surface 106, and edge 120 and field oxide layer 84 will define the extent of lower drain surface 110. Following etching, photoresist layer 116 is removed.

In FIG. 8, photoresist layer 116 exposes a portion of active layer 86 on each side of gate 90. However, in other embodiments active layer could be etched on only one side of gate 90 during the additional etching step.

FIG. 9 illustrates the results of the additional step of etching active layer 86. Following the two etching steps above, and according to the present invention, it should be noted that elevated platform 88 is raised relative to surfaces 104, 106, 108, and 110 of active region 83, as discussed above for FIG. 7. Next, spacers 92 and 94, source and drain regions 96 and 98, and source and drain electrodes 100 and 102 are formed (see FIG. 7), all substantially as previously described to provide MESFET 80.

Although a structure and method in accordance with the present invention have been discussed in the context of MESFET devices, one of skill in the art will recognize that the present invention can be used in other types of devices. For example, the formation of an elevated platform for supporting the bottom surface of a gate element, such as the gate itself or a gate oxide dielectric, so that its bottom surface is elevated relative to the top surface of a portion of the adjoining active region can be used in, for example, metal-oxide semiconductor FETs (MOSFETs). In a MOSFET, the elevated platform would be formed from, for example, a lightly-doped silicon p-well (for an n-channel MOSFET) to elevate the bottom surface of a gate oxide layer, which would itself be under a gate electrode layer, relative to the surface of the adjoining active region.

The structure of the MESFET and the process of its fabrication according to the present invention as described above have several advantages. One important advantage is that the MESFET's threshold voltage has less variability in manufacturing than that for a conventional recessed-gate MESFET. This is so because the channel under the gate is not etched prior to gate formation, as it is in a conventional recessed-gate structure. Thus, variability in threshold voltage due to poor etch control is substantially avoided. Another advantage particularly relevant for RF power devices is that the improved breakdown voltage according to the present invention permits increased output power with reduced side band noise in applications such as cellular phone devices.

Thus, the present invention provides a FET with a self-aligned gate having improved breakdown voltage-current characteristics relative to existing planar MESFET devices. Moreover, this is achieved in a FET that does not rely on a recessed-gate structure and that has a self-aligned gate.

We claim:

1. A field effect transistor comprising:
   a compound semiconductor substrate having an active region in a top portion of said substrate;
   an active layer disposed in said active region of said substrate, said active layer having an elevated platform disposed on an elevated portion of said active layer;
   a source region disposed in contact with a first end of said active layer;
   a drain region disposed in contact with a second end of said active layer wherein said elevated platform is higher than said drain region and said drain region is disposed apart from said elevated portion; and
   a gate layer disposed directly on said elevated platform wherein said gate layer forms a Schottky junction between said gate layer and said active layer, and an edge of said elevated platform is substantially aligned with an edge of said gate layer.

2. The transistor of claim 1 wherein said substrate comprises GaAs or InP.

3. The transistor of claim 2 wherein said active layer is doped with a dopant comprising silicon.

4. The transistor of claim 1 wherein said gate layer comprises a refractory metal.

5. The transistor of claim 4 wherein said gate layer comprises titanium, tungsten, and nitride.

6. The transistor of claim 1 wherein said elevated platform is higher than said source region.

7. A field effect transistor comprising:
   a compound semiconductor substrate having an active region in a top portion of said substrate;
   an active layer disposed in said active region of said substrate, said active layer having an elevated platform;
   a source region disposed in contact with a first end of said active layer;
   a drain region disposed in contact with a second end of said active layer wherein said elevated platform is higher than said drain region; and
   a gate layer disposed directly on said elevated platform wherein said gate layer comprises a refractory metal, said gate layer forms a Schottky junction between said gate layer and said active layer, an edge of said elevated platform is substantially aligned with an edge of said gate layer, and wherein a spacer is disposed adjacent to said gate layer and overlying said active layer.

8. The transistor of claim 7 wherein said source region is substantially self-aligned to said spacer.

9. The transistor of claim 8 wherein said transistor is a depletion transistor with an n-doped channel.

10. A field effect transistor comprising:
    a compound semiconductor substrate having an active region in a top portion of said substrate;
    an active layer disposed in said active region of said substrate, said active layer having an elevated platform disposed on an elevated portion of said active layer wherein an upper surface of said active layer is in a position higher than said drain region and lower than said elevated platform;
    a source region disposed in contact with a first end of said active layer;
    a drain region disposed in contact with a second end of said active layer wherein said elevated platform is higher than said drain region and said drain region is disposed apart from said elevated portion; and
    a gate layer disposed directly on said elevated platform wherein said gate layer forms a Schottky junction between said gate layer and said active layer.

11. A metal semiconductor field effect transistor comprising:
    a compound semiconductor substrate having a field oxide layer disposed thereon that defines an active region in a surface portion of said substrate;
    an active layer disposed in said active region, wherein said active layer has an elevated platform;
    a refractory metal gate layer formed directly on said elevated platform, wherein an edge of said elevated platform is substantially aligned with an edge of said gate layer; and
    source and drain regions disposed in said active region on opposite sides of said gate layer, wherein said elevated platform is higher than said source region and higher than said drain region.

12. The transistor of claim 11 wherein at least one of said source and drain regions is substantially self-aligned to said gate layer.

13. The transistor of claim 13 wherein said substrate comprises GaAs or InP.

14. The transistor of claim 13 wherein: said substrate is substantially un-doped GaAs; and said active region and said source and drain regions are n-type and doped with silicon.

15. A metal semiconductor field effect transistor comprising:
    a compound semiconductor substrate having a field oxide layer disposed thereon that defines an active region in a surface portion of said substrate;
    an active layer disposed in said active region, wherein said active layer has an elevated platform and has an upper surface in a position higher than said drain region and lower than said elevated platform;
    a refractory metal gate layer formed directly on said elevated platform; and
    source and drain regions disposed in said active region on opposite sides of said gate layer, wherein said elevated platform is higher than said source region and higher than said drain region.

* * * * *